United States Patent [19]
Tokumitsu

[11] Patent Number: 5,238,856
[45] Date of Patent: Aug. 24, 1993

[54] METHOD OF MANUFACTURING SOLID-STATE IMAGE PICK-UP DEVICE

[75] Inventor: Kenichi Tokumitsu, Yokohama, Japan

[73] Assignee: Kabushiki Kaisha Toshiba, Kanagawa, Japan

[21] Appl. No.: 993,078

[22] Filed: Dec. 18, 1992

[30] Foreign Application Priority Data

Dec. 19, 1991 [JP] Japan ................ 3-335363

[51] Int. Cl.[5] ........................................... H01L 31/18
[52] U.S. Cl. ........................................ 437/2; 437/3; 437/4; 358/41; 358/44
[58] Field of Search .......................... 437/2, 3, 4, 228; 358/41, 44; 257/98

[56] References Cited

U.S. PATENT DOCUMENTS

| | | | |
|---|---|---|---|
| 4,571,448 | 2/1986 | Barnett | 437/2 |
| 4,667,092 | 5/1987 | Ishimara | 250/216 |
| 4,703,214 | 10/1987 | Mesguida | 257/98 |
| 4,721,999 | 1/1988 | Tamemura et al. | 358/44 |
| 4,786,819 | 11/1988 | Tei | 358/44 |
| 4,861,387 | 8/1989 | Matsumoto | 437/2 |
| 4,882,616 | 11/1989 | Manabe | 358/41 |
| 4,920,075 | 4/1990 | Morita | 437/228 |
| 4,968,354 | 11/1990 | Nishiura et al. | 437/2 |
| 5,028,547 | 7/1991 | Iizuka et al. | 437/2 |
| 5,132,251 | 7/1992 | Kim et al. | 437/3 |

*Primary Examiner*—Brian E. Hearn
*Assistant Examiner*—Kevin M. Picardat
*Attorney, Agent, or Firm*—Finnegan, Henderson, Farabow, Garrett & Dunner

[57] ABSTRACT

A method of manufacturing an image pick-up device having at least two photoelectric conversion elements which convert incident light to electric signals. The elements are formed on a semiconductor substrate. A transparent material layer is formed on the substrate so that the elements are covered with the layer. A first thermally deformable resin section is formed at a first location on the layer, the first location corresponding to a location of one of the elements. The first resin section is heated and deformed to be a first condenser lens. After the first resin section is formed, a second thermally deformable resin section is formed at a second location on the layer, the second location corresponding to a location of another of the elements. And the second resin section is heated and deformed to be a second condenser lens so that optical axes of the first and second lenses do not meet each other.

3 Claims, 7 Drawing Sheets

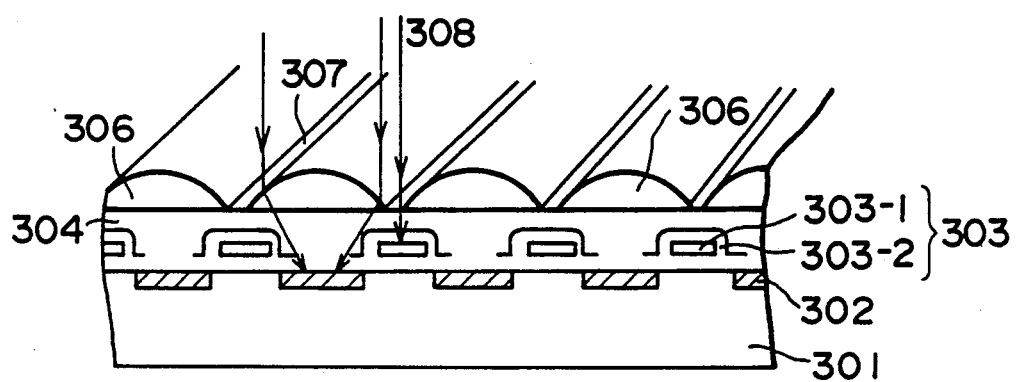
F I G. 1

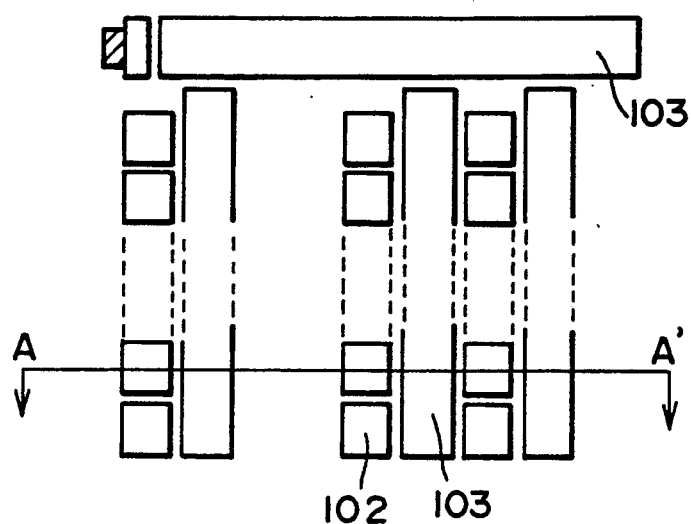
F I G. 2
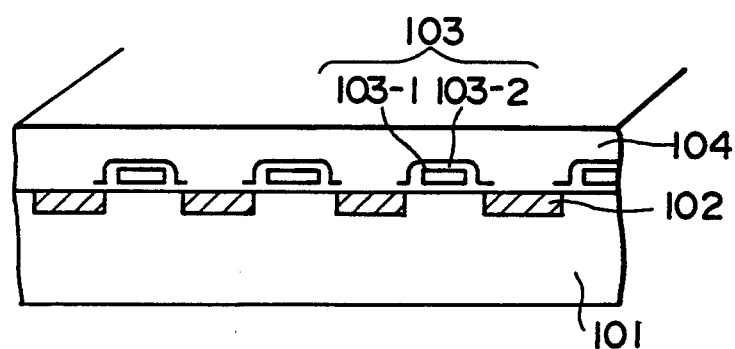
F I G. 3

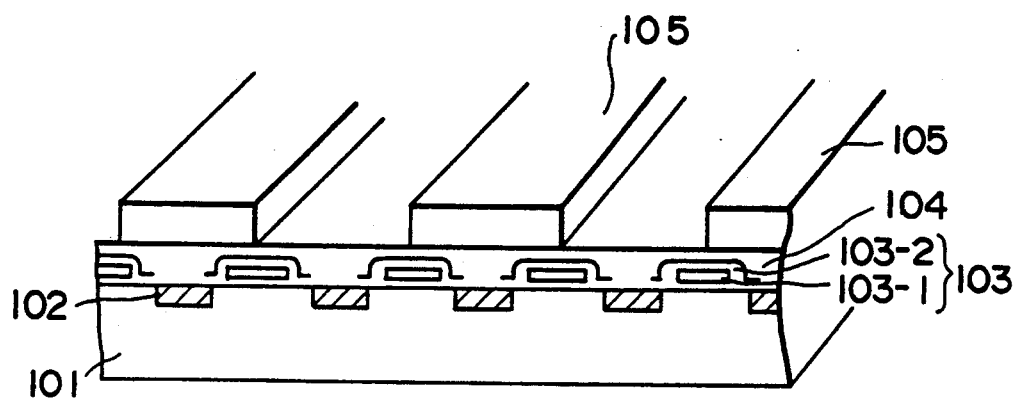
F I G. 4
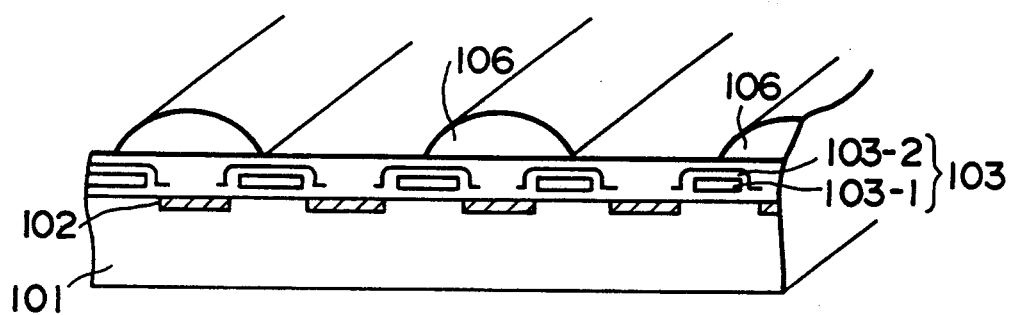
F I G. 5

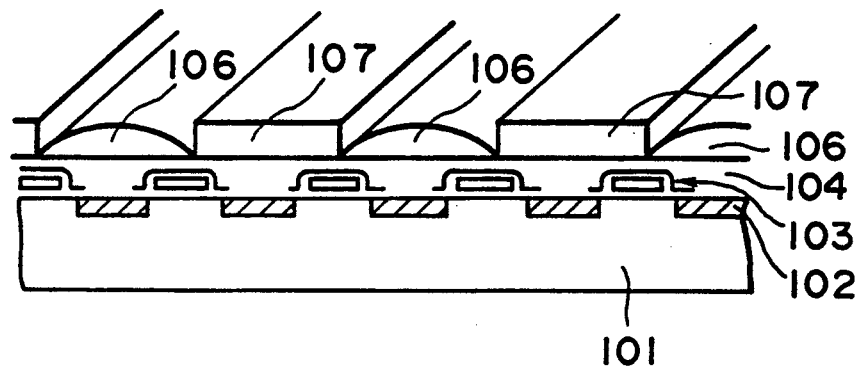
F I G. 6
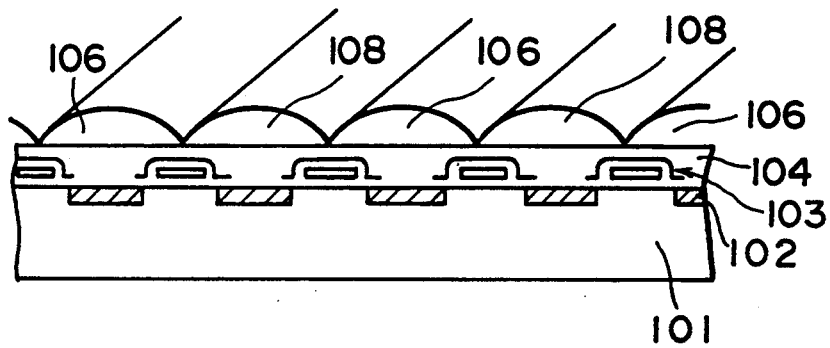
F I G. 7

| a | b | a | b | a |
|---|---|---|---|---|
| c | d | c | d | c |
| a | b | a | b | a |
| d | c | d | c | d |
| a | b | a | b | a |
| c | d | c | d | c |
F I G. 10
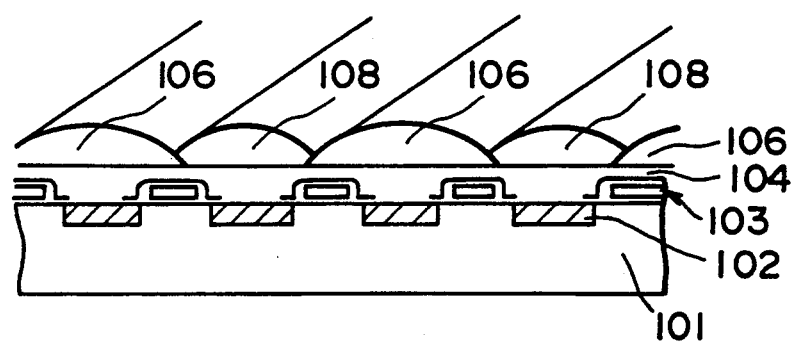
F I G. 11

METHOD OF MANUFACTURING SOLID-STATE IMAGE PICK-UP DEVICE

BACKGROUND OF THE INVENTION

The present invention relates to a method of manufacturing a solid-state image pick-up device, and more specifically to the method of manufacturing condenser lenses provided over light receiving portions of the solid-state image pick-up device.

In general, a solid-state image pick-up device is configured by arranging a plurality of solid-state image pick-up elements corresponding to pixels on a silicon substrate. The respective solid-state image pick-up element is composed of a light receiving portion (e.g. a photodiode) for transducing incident light into an electric signal and an electric charge transferring portion for transferring the transduced electric signal to a signal processing portion.

In order to decrease the size and increase the sensitivity of the solid-state image pick-up device as described above, it is well known such a method that condenser lenses are formed over the light receiving portions to condense the incident light onto the light receiving portions. This method is effective to improve the sensitivity of the received light, without increasing the size of the image pick-up device.

As a conventional method of manufacturing the condenser lenses, there have been known the method of RIE (reactive ion etching) technique, the method of deforming a thermally deformable resin patterned in accordance with the respective light receiving portions, etc.

FIG. 1 is a cross-sectional view showing the essential portions of the solid-state image pick-up device provided with the condenser lenses formed in accordance with the conventional method.

In the drawing, the device is formed by arranging, on a silicon substrate 301, light receiving portions 302 and electric charge transferring portions 303 having a gate electrode 303-1 and a light shading film 303-2, respectively. A transparent resin layer 304 is formed on these portions in order to make uniform the surface of the portions and further allow condenser lenses to become in-focus condition. Further, a plurality of semicylindrical condenser lenses 306 are formed on the transparent resin layer 304 so as to be located over the light receiving portions 302, respectively, with spaces (unavailable regions) 307 interposed between the two adjacent condenser lenses 306, respectively.

To form the above-mentioned condenser lenses 306, a thermally deformable resin layer such as photoresist, for instance is formed on the transparent resin layer 304; and the formed resin layer is further patterned to a thermally deformable striped resin layer so that each stripe of the resin layer is located over each light receiving portion 302. Further, the thermally deformable striped resin layer is heat treated to deform the layer into the shapes corresponding to the condenser lenses 306.

The above-mentioned unavailable regions 307 between the two adjacent condenser lenses 306 (which do not cover the solid-state image pick-up device) are necessary to prevent the two adjacent striped portions of the thermally deformable resin layer from being connected to each other during the heat treatment. In other words, the presence of the unavailable regions 307 serves to prevent both the ends of the condenser lenses from being formed irregularly in shape.

In the conventional method, therefore, since the areas of the unavailable regions 307 cannot be reduced so much, there exists a problem in that the light condensing efficiency of the condenser lens is inevitably reduced, with the result that it is impossible to further increase the light receiving sensitivity of the solid-state image pick-up device.

In addition, when the condenser lenses are formed in accordance with the conventional method, since the areas of the unavailable ranges 307 are not small, the quantity of light 308 allowed to be incident upon the unavailable regions 307 inevitably increases, as shown in FIG. 1.

Consequently, without only reducing the effective light signal components, the unavailable light are reflected at random from the surface or the inner portions of the transparent resin layer 304 and the light shading films 303-2, with the result that there raise other problems in that pairs of electron and hole are produced; smear is generated; and noise is increased, thus reducing the light receiving sensitivity of the solid-state image pick-up device.

SUMMARY OF THE INVENTION

An object of the invention is to provide a method of manufacturing an image pick-up device with high light receiving sensitivity.

According to the present invention, there is provided a method of manufacturing an image pick-up device having at least two photoelectric conversion elements which convert incident light to electric signals, the method comprising the steps of: forming the elements on a semiconductor substrate; forming a transparent material layer on the substrate so that the elements are covered with the layer; forming a first thermally deformable resin section at a first location on the layer, the first location corresponding to a location of one of the elements; heating and deforming the first resin section to form a first condenser lens; forming a second thermally deformable resin section, after the first resin section being formed, at a second location on the layer, the second location corresponding to a location of another of the elements; and heating and deforming the second resin section to form a second condenser lens so that optical axes of the first and second lenses do not meet each other.

Furthermore, according to the present invention, the second lens forming step, in the above-mentioned method, comprises the step of making a portion of the second lens overlap with a portion of the first lens.

Still furthermore, according to the present invention, the second resin section forming step comprises the step of making a thickness of the second resin section being different from a thickness of the first resin section.

BRIEF DESCRIPTION OF THE DRAWINGS

FIG. 1 is a cross-sectional view showing the essential portions of the solid-state image pick-up device provided with condenser lenses formed in accordance with a conventional method;

FIG. 2 is a plan view showing the solid-state image pick-up device, in which the manufacturing method of the present invention is applied to a CCD area sensor;

FIG. 3 is a cross-sectional view showing the solid-state image pick-up device taken along the line A—A' in FIG. 2;

FIG. 4 is a cross-sectional view showing an embodiment of the solid-state image pick-up device in one step of the manufacturing method according to the present invention;

FIG. 5 is a cross-sectional view showing an embodiment of the solid-state image pick-up device in another step of the manufacturing method according to the present invention;

FIG. 6 is a cross-sectional view showing an embodiment of the solid-state image pick-up device in still another step of the manufacturing method according to the present invention;

FIG. 7 is a cross-sectional view showing an embodiment of the solid-state image pick-up device in further step of the manufacturing method according to the present invention;

FIG. 10 is a plane view showing the solid-state image pick-up devices formed with other island-type condenser lenses;

FIGS. 11 is a cross-sectional view showing the solid-state image pick-up devices formed with overlapped condenser lenses;

DETAILED DESCRIPTION OF THE PREFERRED EMBODIMENTS

Figures 8, 9:
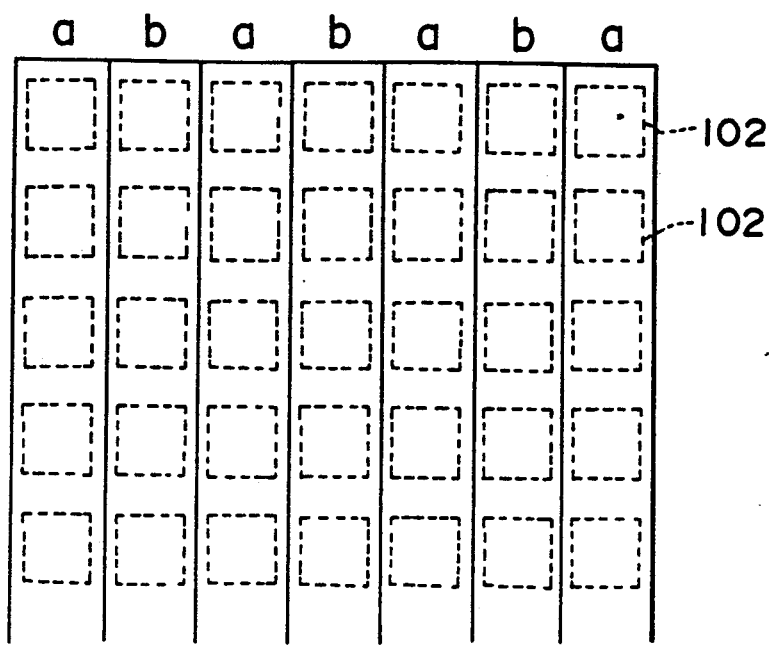
FIG. 8 is a plane view showing the solid-state image pick-up devices formed with the striped condenser lenses.
FIG. 9 is a plane view showing the solid-state image pick-up devices formed with island-type condenser lenses.

The embodiments of the present invention will be described hereinbelow in detail with reference to the attached drawings.

FIG. 2 is a plane view showing a solid-state image pick-up device in which the manufacturing method of the present invention is applied to a CCD (charge coupled device) area sensor.

As shown in FIG. 2, the solid-state image pick-up device is composed of light receiving portions 102 (e.g. photodiodes) for transducing incident light into an electric signal and electric charge transferring portions 103 for transferring the electric signal to a signal processing portion (not shown). FIG. 3 is a cross-sectional view taken along the line A—A' in FIG. 2.

In FIG. 3, the solid-state image pick-up device is formed by arranging the light receiving portions 102 and the electric charge transferring portions 103 having a gate electrode 103-1 and a light shading film 103-2, respectively on a silicon substrate 101 in parallel positional relationship with respect to each other. Further, a transparent resin layer 104 is formed on these portions in order to make uniform the surface of the portions and further allow condenser lenses to become in-focus condition. Further, in the case of a color solid-state image pick-up device, color filters are formed on the respective light receiving portions 102 and further a protective film is formed thereon. The above-mentioned respective process can be achieved in accordance with a conventional method so far well known.

Successively, as shown in FIG. 4, a thermally deformable resin layer such as photoresist is formed on the transparent resin layer 104. Further, the formed resin layer is patterned on alternate lines to form first striped layers 105 in such a way that the respective striped layers are located over the respective light receiving portions 102.

Successively, as shown in FIG. 5, the first stripe layers 105 are deformed by heat treatment (for example for 5 minutes at a temperature of 140° C.) to form first semicylindrical condenser lenses 106 on alternate lines over the light receiving portions 102. Here, as far as the material of the first striped layer 105 is at least thermally deformable and further thermally hardenable (for example, novolac type positive photoresist), the shape of the first condenser lenses 106 will not be deformed by the succeeding heat treatment.

Further, since the condenser lenses 106 are formed on alternate lines in relation to the light receiving portions 102, there exists the light receiving portions 102 having no condenser lenses thereover on alternate lines. Therefore, as shown in FIG. 6, another thermally deformable resin layer such as photoresist is formed again all over the surface of the device. Further, the formed resin layer is patterned on alternate lines to form second striped layers 107 in such a way that the respective striped layers are located over the respective remaining light receiving portions 102 (over which no first condenser lenses 106 are formed).

Successively, as shown in FIG. 7, the second stripe layers 107 are deformed by the heat treatment to form second semicylindrical condenser lenses 108 on alternate lines over the light receiving portions 102. As described above, it is possible to form the condenser lenses over all the light receiving portions 102.

As shown in FIG. 7, in the present embodiment there exists no unavailable regions 307 (shown in FIG. 1) between the two adjacent condenser lenses 106 and 108.

Further, since the first striped layers 105 are formed of the above-mentioned (thermally deformable and hardenable) material, the shape of the first condenser lenses 106 are not subjected to the influence of the second heat treatment for forming the second condenser lenses 108. Therefore, it is possible to form the second striped layer 107 so as to be in contact with the first condenser lenses 106; that is, it is possible to arrange the condenser lenses in such a way that both ends of the lenses 106 and 108 are not connected to each other to prevent both the ends of the lenses from being formed irregularly in shape. Accordingly, the solid-state image pick-up device can be manufactured at a higher integration rate. Further, since unnecessary signal components as explained in the image pick-up device manufactured in accordance with the conventional method can be eliminated, noise signal can be reduced and thereby the light receiving sensitivity can be increased.

In the above-mentioned embodiment, the method of the present invention is applied to the CCD area sensor. However, the method according to the present invention can be also applied to a CCD line sensor.

Further, in the above-mentioned embodiment, although the condenser lenses are formed by two different steps, without being limited to the two steps, it is of course possible to form the condenser lenses by three or more different steps.

Further, in the above-mentioned embodiment, a plurality of light receiving portions 102 are covered by the semicylindrical lenses in such a way that condenser lens lines can be formed alternately, as shown by a plane view in FIG. 8. In more detail, the first condenser lens lines a are formed and thereafter the second condenser lens lines b are formed, alternately.

Without being limited to the semicylindrical condenser lenses formed on the alternate lines, however, it is also possible to form an independent condenser lens (island condenser lens) on each light receiving portion, as shown by a plane view in FIG. 9. In this method, a plurality of condenser lenses a are formed simultaneously and then a plurality of other condenser lenses b are formed simultaneously. In this method, it is possible to prevent the condenser lenses from being connected to each other more effectively than the case where all the condenser lenses are formed simultaneously.

However, there exists a problem in that the corners of the respective condenser lenses (e.g. the condenser lenses a) are connected to each other. Although this problem can be overcome by modifying the shape of the condenser lens (e.g. the corner angles of the lens are rounded off), this method inevitably causes the unavailable regions to be formed. However, this problem can be solved by the method as shown in FIG. 10. In FIG. 10, the condenser lenses are formed by four different steps in the order of a, b, c, and d. In this method, since the two adjoining lenses are not formed simultaneously, it is possible to eliminate the unavailable regions.

Further, in FIG. 7, the first condenser lenses 106 and the second condenser lenses 108 are formed so as to be in contact with each other. Without being limited thereto, however, it is possible to form both the condenser lenses 106 and 108 so as to be overlapped with each other at both ends thereof as shown in FIG. 11. In this embodiment, it is necessary to match the refractive index of the first striped layer 105 with that of the second striped layer 107. In this method, it is also possible to eliminate the unavailable regions.

In the case of color solid-state image pick-up devices, there exists a problem in that the sensitivities of the light receiving portions differ according to colors. In more detail, when three primary color (red, blue and yellow) filters are used, the sensitivity of the blue is low. In the case when complementary color filters (cyan, magenta, green and yellow) are used, although the sensitivities thereof are uniform to some extent, it is necessary to adjust the sensitivities thereof by finely changing the thicknesses of the filers. However, when the light receiving portions are reduced in size and therefore the color filters are also reduced in thickness, it is necessary to adjust the sensitivities of the color filters in a different way.

In the embodiment of the present invention, the condenser lenses are formed in several different steps. That is, in the respective steps, by changing the thickness of the thermally deformable resin layer for forming the condenser lenses, it is possible to form the condenser lenses with a radius of curvature different from each other, so that the sensitivity of the light receiving portions can be adjusted according to the respective pixel colors. This method of changing the thickness of the resin layer is simple as compared with the case where the sensitivities thereof are adjusted by changing the sizes of the lenses.

In this embodiment, when the complementary color (cyan, magenta, green and yellow) filters are used, 8-piece light receiving portions are formed as a single block.

Figure 12:
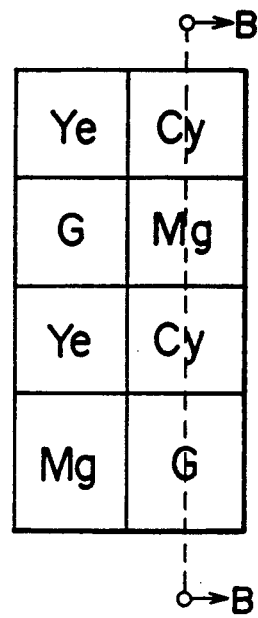
FIG. 12 is an illustration for assistance in explaining a color arrangement of the complementary color filters over the light receiving portions of the color image pick-up device.

FIG. 12 shows the distribution of the colors at the respective light receiving portions. Here, if the four colors shown in FIG. 12 are allocated to the marks a, b, c, and d shown in FIG. 10, a indicates Ye (yellow); b indicates Cy (cyan); c indicates G (green); and d indicates Mg (magenta), respectively. Here, if the sensitivity of the cyan is low, the thickness of the thermally deformable resin layer formed on the portions b is increased so that the radius of curvature of the condenser lenses is increased to adjust the focal depth and thereby to increase the quantity of light allowed to be incident upon the light receiving portions b. In this case, since the condenser lenses located over the respective color portions are formed in different steps independently, the condenser lenses are not formed into the striped shape but formed into the island shape, and further the thermal deformation process is required 4 times per block.

Figure 13:
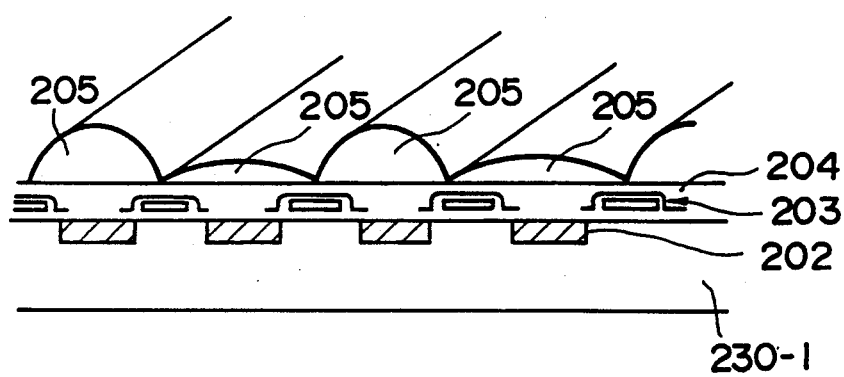
FIG. 13 is a cross-sectional view showing the regions taken along the line B—B' in FIG. 12.

FIG. 13 is a cross-sectional view taken along the line B—B' in FIG. 12, in which the condenser lenses with different radii of curvature formed as described above are depicted. As described above, it is possible to freely adjust the sensitivities of the respective colors of the CCD sensor.

As described above, in the method according to the present invention, it is possible to form a plurality of condenser lenses in appropriate shapes, without forming wasteful gaps (unavailable regions) between the two adjacent condenser lenses. Accordingly, it is possible to reduce the smear and its related noise as involved in the image pick-up device manufactured in accordance with the conventional method and to condense wide range incident light onto the light receiving portions effectively, thus increasing the light receiving sensitivity.

Further, as shown in FIG. 13, since the radius of curvature of the condenser lens can be modified by adjusting the thickness of the thermally deformable resin layer for forming the condenser lenses for each step, it is possible to adjust the sensitivity of the specific light receiving portions independently, so that the sensitivities of the light receiving portions can be adjusted according to the respective colors in the case of the color solid-state image pick-up device.

What is claimed is:

1. A method of manufacturing an image pick-up device having at least two photoelectric conversion elements which convert incident light to electric signals, the method comprising the steps of:

forming the elements on a semiconductor substrate;

forming a transparent material layer on the substrate so that the elements are covered with the layer;

forming a first thermally deformable resin section at a first location on the layer, the first location corresponding to a location of one of the elements;

heating and deforming the first resin section to form a first condenser lens;

forming a second thermally deformable resin section, after the first resin section being formed, at a second location on the layer, the second location corresponding to a location of another of the elements; and heating and deforming the second resin section to form a second condenser lens so that optical axes of the first and second lenses do not meet each other.

2. A method according to claim 1, wherein the second lens forming step comprises the step of making a portion of the second lens overlap with a portion of the first lens.

3. A method according to claim 1, wherein the second resin section forming step comprises the step of making a thickness of the second resin section being different from a thickness of the first resin section.

* * * * *